(12) United States Patent
Kim

(10) Patent No.: US 9,054,715 B2
(45) Date of Patent: Jun. 9, 2015

(54) DELAY LOCKED LOOP AND SEMICONDUCTOR APPARATUS

(71) Applicant: SK hynix Inc., Icheon-si Gyeonggi-do (KR)

(72) Inventor: Kwan Dong Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 54 days.

(21) Appl. No.: 13/845,270

(22) Filed: Mar. 18, 2013

(65) Prior Publication Data
US 2014/0176206 A1 Jun. 26, 2014

(30) Foreign Application Priority Data

Dec. 24, 2012 (KR) .................... 10-2012-0152233

(51) Int. Cl.
*H03L 7/06* (2006.01)
*H03L 7/081* (2006.01)
*H03L 7/085* (2006.01)
*H03L 7/097* (2006.01)

(52) U.S. Cl.
CPC ............ *H03L 7/0814* (2013.01); *H03L 7/0816* (2013.01); *H03L 7/085* (2013.01); *H03L 7/097* (2013.01)

(58) Field of Classification Search
USPC ........................................... 327/158
See application file for complete search history.

(56) References Cited

U.S. PATENT DOCUMENTS

| | | | | |
|---|---|---|---|---|
| 7,859,344 B2* | 12/2010 | Uozumi et al. | ............... | 331/1 A |
| 8,035,431 B2* | 10/2011 | Kim et al. | ............... | 327/158 |
| 2007/0085570 A1* | 4/2007 | Matsuta | ............... | 327/3 |
| 2011/0227621 A1* | 9/2011 | Ridgers | ............... | 327/159 |
| 2012/0025879 A1* | 2/2012 | Matsuda | ............... | 327/156 |

FOREIGN PATENT DOCUMENTS

| | | |
|---|---|---|
| KR | 1020070054455 A | 5/2007 |
| KR | 1020090117118 A | 11/2009 |

* cited by examiner

*Primary Examiner* — Lincoln Donovan
*Assistant Examiner* — Patrick Chen
(74) *Attorney, Agent, or Firm* — William Park & Associates Ltd.

(57) ABSTRACT

A delay locked loop includes: a variable delay unit configured to delay a reference clock signal in response to a delay code and generate a delay locked loop clock signal; a delay model unit configured to delay the delay locked loop clock signal by a modeled delay value and output delayed delay locked loop clock signal as a feedback clock signal; a calculation code generation unit configured to convert a phase of the reference clock signal and a phase of the feedback clock signal into a first code and a second code, respectively, and perform a calculation on the first and second codes so as to generate a calculation code; and a delay code generation unit configured to control the delay code in response to the calculation code.

11 Claims, 6 Drawing Sheets

DELAY LOCKED LOOP AND SEMICONDUCTOR APPARATUS

CROSS-REFERENCES TO RELATED APPLICATION

The present application claims priority under 35 U.S.C. §119(a) to Korean application number 10-2012-0152233 filed on Dec. 24, 2012 in the Korean Intellectual Property Office, which is incorporated herein by reference in its entirety.

BACKGROUND

1. Technical Field

Various embodiments generally relate to a semiconductor integrated circuit, and more particularly, to a delay locked loop.

2. Related Art

A semiconductor apparatus is operated by a clock is synchronization system, in order to guarantee a high-speed operation without an error. At this time, when an external clock signal is used inside the semiconductor apparatus, clock skew caused by an internal circuit occurs in data outputted from the semiconductor apparatus. Therefore, a delay locked loop is provided to generate a delay locked loop (DLL) clock signal by compensating for a modeled delay value tREP obtained by modeling a delay amount of the internal circuit of the semiconductor apparatus, that is, a delay amount of a path through which data is outputted. Inside the semiconductor apparatus, the DLL clock signal may be used to output data to the outside in synchronization with an external clock signal.

FIG. 1 is a block diagram of a conventional delay locked loop.

The delay locked loop of FIG. 1 includes a variable delay unit 1, a delay model unit 2, a phase comparison unit 3, and a delay code generation unit 4.

The variable delay unit 1 is configured to control a delay amount of a reference clock signal REFCLK in response to a delay code D_CODE and generate a DLL clock signal DLLCLK.

The delay model unit 2 is configured to delay the DLL clock signal DLLCLK by a modeled delay value tREP and generate a feedback clock signal FBCLK.

The phase comparison unit 3 is configured to compare the phases of the feedback clock signal FBCLK and the reference clock signal REFCLK and generate a phase detection signal UP_DN according to the comparison result. The phase detection signal UP_DN is updated at a predetermined period until the feedback clock signal FBCLK and the reference clock signal REFCLK have the same phase. When the feedback clock signal FBCLK and the reference clock signal REFCLK have substantially the same phase, the delay locked loop is locked.

The delay code generation unit 4 is configured to generate a delay code D_CODE in response to the phase detection signal UP_DN.

In a system which operates at high speed and frequently performs a power down mode to reduce power, a delay locked loop needs to be locked within a short time such that the semiconductor apparatus normally operates.

SUMMARY

In an embodiment, a delay locked loop includes: a variable delay unit configured to delay a reference clock signal in response to a delay code and generate a delay locked loop clock signal; a delay model unit configured to delay the delay locked loop clock signal by a modeled delay value and output delayed delay locked loop clock signal as a feedback clock signal; a calculation code generation unit configured to convert a phase of the reference clock signal and a phase of the feedback clock signal into a first code and a second code, respectively, and perform a calculation on the first and second codes so as to generate a calculation code; and a delay code generation unit configured to control the delay code in response to the calculation code.

In an embodiment, a semiconductor apparatus includes: a variable delay unit configured to delay a reference clock signal in response to a delay code and generate a delay locked loop clock signal; a delay model unit configured to delay the delay locked loop clock signal by a modeled delay value and output delayed delay locked loop clock signal as a feedback clock signal; a calculation code generation unit configured to convert a phase of the reference clock signal and a phase of the feedback clock signal into a first code and a second code, respectively, and perform a calculation the first and second codes so as to generate a calculation code; a division unit configured to divide the reference clock signal by a predetermined multiple and generate a divided clock signal; and a delay code generation unit configured to receive the calculation code and update the delay code, in synchronization with the divided clock signal.

BRIEF DESCRIPTION OF THE DRAWINGS

Features, aspects, and embodiments are described in conjunction with the attached drawings, in which.

DETAILED DESCRIPTION

Hereinafter, a delay locked loop and a semiconductor apparatus according to the present invention will be described below with reference to the accompanying drawings through various embodiments.

Figure 1:
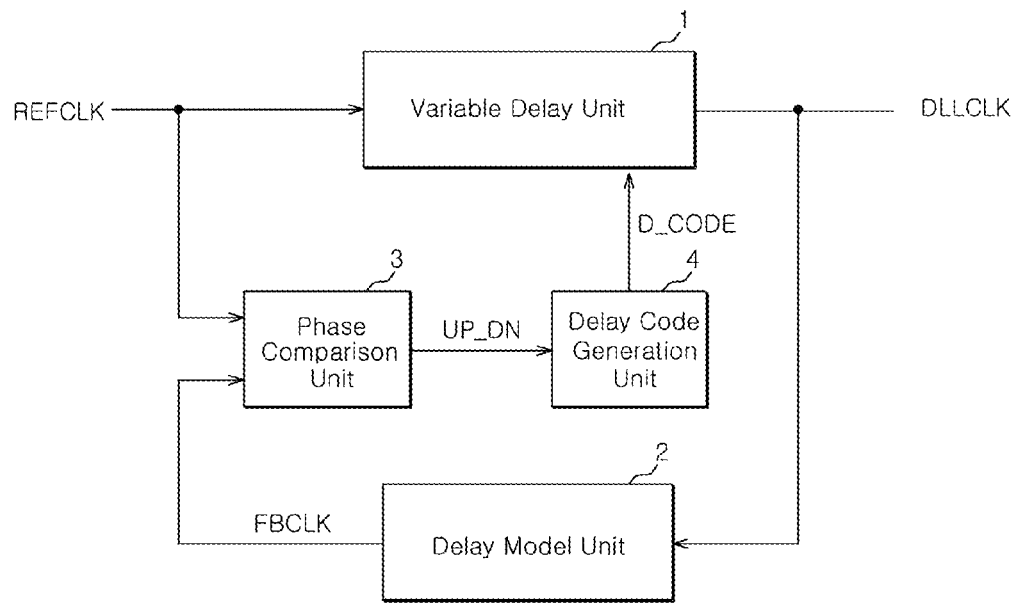
FIG. 1 is a block diagram of a conventional delay locked loop.
Figure 2:
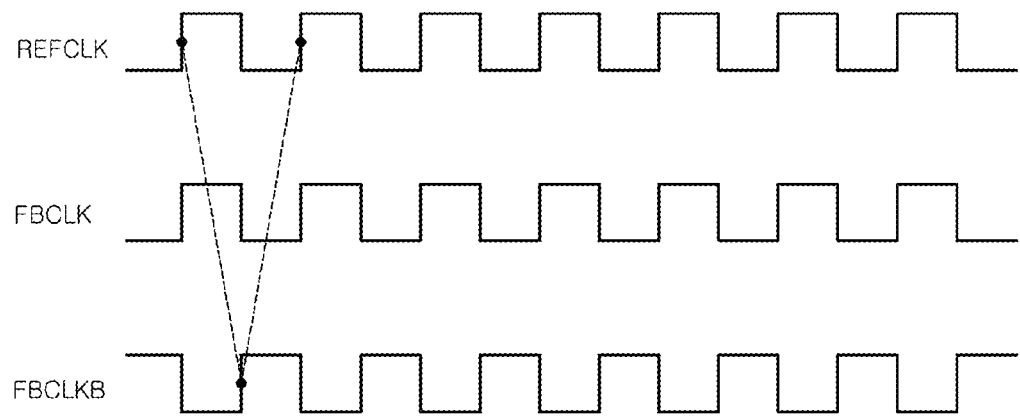
FIG. 2 is a waveform diagram when a delay locked loop is locked.

FIG. 2 is a waveform diagram when a delay locked loop is locked.

In general, a delay locked loop receives a reference clock signal REFCLK, and delays the received signal to generate a DLL clock signal. The delay locked loop further delays the DLL clock signal by a modeled delay value tREP and generates a feedback clock signal FBCLK. When the reference clock signal REFCLK and the feedback clock signal FBCLK have substantially the same phase, the delay locked loop is locked. Therefore, when the delay locked loop is locked, the reference clock signal REFCLK has a half-period phase difference, that is, a phase difference of 180 degrees from an inverted feedback clock signal FBCLKB.

Figure 3:
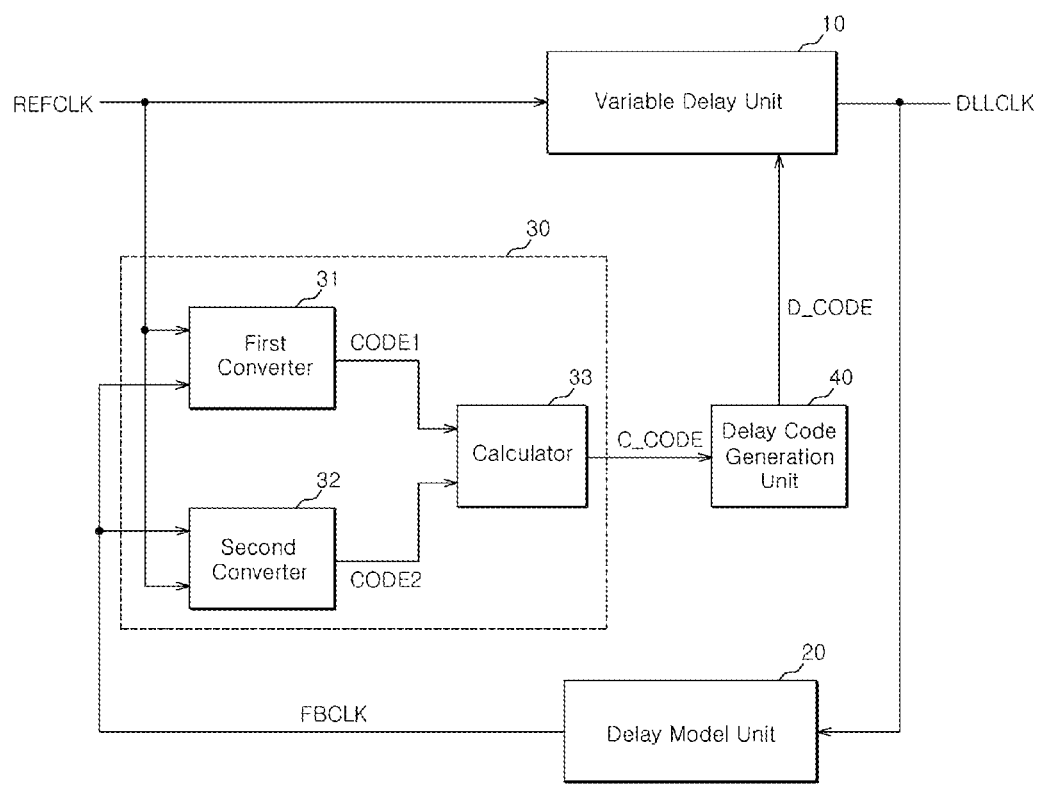
FIG. 3 is a block diagram of a delay locked loop according to an embodiment of the present invention.

FIG. 3 is a block diagram of a delay locked loop according to an embodiment of the present invention.

The delay locked loop of FIG. 3 may include a variable delay unit 10, a delay model unit 20, a calculation code generation unit 30, and a delay code generation unit 40.

The variable delay unit 10 may be configured to control a delay amount of a reference clock signal REFCLK in response to a delay code D_CODE and generate a DLL clock signal DLLCLK.

The delay model unit 20 may be configured to delay the DLL clock signal DLLCLK by a modeled delay value tREP and generate a feedback clock signal FBCLK.

The calculation code generation unit 30 may be configured to convert the phase of the reference clock signal REFCLK and the phase of the feedback clock signal FBCLK into codes, and perform a calculation on the codes in a digital manner so as to generate a calculation code C_CODE. That is, while a general delay locked loop determines a phase difference between the reference clock signal and the feedback clock signal in an analog manner, the delay locked loop according to the embodiment of the present invention converts the phases of the reference clock signal REFCLK and the feedback clock signal FBCLK into digital codes, and generates the calculation code C_CODE through a calculation on the digital codes. Owing to the digital operation, the delay locked loop according to the embodiments is of the present invention operates at higher speed than the general delay locked loop.

In an embodiment, the calculation code generation unit 30 may include a first converter 31, a second converter 32, and a calculator 33.

The first converter 31 may be configured to generate the phase of the reference clock signal REFCLK as a first code CODE1. The second converter 32 may be configured to generate the phase of the feedback clock signal FBCLK as a second code CODE2. Therefore, as the phase difference between the reference clock signal REFCLK and the feedback clock signal FBCLK increases, a difference between the first code CODE1 and the second code CODE2 increases.

The calculator 33 may be configured to calculate the difference between the first and second codes CODE1 and CODE2 and generate the calculation code C_CODE. For example, when the phase of the reference clock signal REFCLK leads the phase of the feedback clock signal FBCLK based on 180 degrees, the calculator 33 generates a negative (−) calculation code C_CODE. On the other hand, when the phase of the reference clock signal REFCLK lags the phase of the feedback clock signal FBCLK, the calculator 33 generates a positive (+) calculation code C_CODE. The sign of the calculation code C_CODE determines an increase or decrease in delay amount of the variable delay unit 10, which will be described below.

The delay code generation unit 40 may be configured to generate a delay code D_CODE in response to the calculation code C_CODE. The delay code generation unit 40 may have a feedback loop structure, for example. That is, the delay code generation unit 40 stores an existing delay code D_CODE, and adds the calculation code C_CODE to the stored delay code D_CODE so as to generate a new delay code D_CODE. The new delay code D_CODE is stored in the delay code generation unit 40. Such a process is performed until the delay locked loop is locked.

Specifically, when the calculation code C_CODE having a positive value is applied, the delay code D_CODE is increased. According to the magnitude of the calculation code C_CODE, the increase of the delay code D_CODE is determined.

On the other hand, when the calculation code C_CODE having a negative value is applied, the delay code D_CODE is decreased. According to the magnitude of the calculation code C_CODE, the decrease of the delay code D_CODE is determined.

The variable delay unit 10 controls the delay amount of the reference clock signal REFCLK in response to the delay code D_CODE. For example, when the delay code D_CODE is increased, the variable delay unit 10 increases the delay amount, and when the delay code D_CODE is decreased, the variable delay unit 10 decreases the delay to amount.

Figure 4:
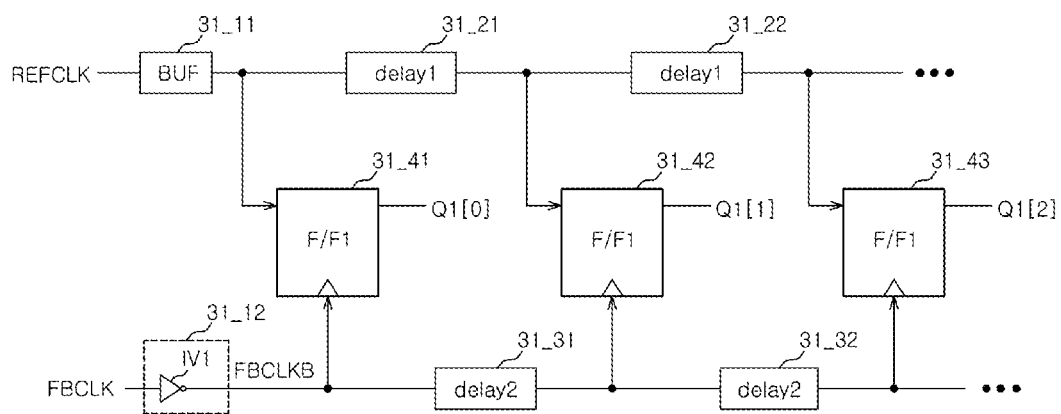
FIG. 4 is a circuit diagram illustrating an embodiment of a first converter of FIG. 3.

FIG. 4 is a circuit diagram illustrating an embodiment of the first converter 31.

The first converter 31 uses an inverted feedback clock signal FBCLKB to convert the phase of the reference clock signal REFCLK into the first code CODE1. The first converter 31 latches the reference clock signal REFCLK using the inverted feedback clock signal FBCLKB, and thus converts the phase of the reference clock signal REFCLK into a first latch code Q1[0] to Q1[2].

Specifically, the first converter 31 may include a buffer 31_11, an inverter (IV1) 31_12, a plurality of first delays 31_21 and 31_22, a plurality of second delays 31_31 and 31_32, and a plurality of first flip-flops 31_41 to 31_43.

The inverter 31_12 may be configured to receive the feedback clock signal FBCLK and generate the inverted feedback clock signal FBCLKB.

The buffer 31_11 may be configured to receive the reference clock signal REFCLK and delay the reference clock signal REFCLK by the same delay amount as a delay amount of the inverter 31_12. The buffer 31_11 serves to compensate for the delay amount caused by the inverter 31_12.

The plurality of first delays 31_21 and 31_22 are configured to sequentially delay the reference clock signal REFCLK by a first delay amount.

The plurality of second delays 31_31 and 31_32 are configured to sequentially delay the inverted feedback signal FBCLKB by a second delay amount.

Additionally, the first delay amount may be set to be larger than the second delay amount.

The plurality of first flip-flops 31_41 to 31_43 are configured to latch the reference clock signal REFCLK and outputs of the first delays 31_21 and 31_22 in response to the inverted feedback clock signal FBCLK and outputs of the second delays 31_31 and 31_32, respectively, and output the latch results as the respective bits of the first latch code Q1[0] to Q1[2]. That is, the plurality of first flip-flops 31_41 to 31_43 delay the reference clock signal REFCLK by a predetermined phase based on the inverted feedback clock signal FBCLK, and output the level of the reference clock signal REFCLK as the first latch code Q1[0] to Q1[2]. Therefore, the phase information of the reference clock signal REFCLK is reflected into the first latch code Q1[0] to Q1[2].

The delay locked loop is locked when the reference clock signal REFCLK and the feedback clock signal FBCLK have substantially the same phase. Therefore, when the delay locked loop is locked, the reference clock signal REFCLK and the inverted feedback clock signal FBCLKB have a phase difference of 180 degrees. When the initial phase of the feedback clock signal FBCLK lags the phase of the reference clock signal REFCLK, that is, when the phase difference between the inverted feedback clock signal FBCLKB and the reference clock signal REFCLK is larger than 180 degrees and smaller than 360 degrees, the first code Q1[0] to Q1[2] may be generated as 00111100 from the most significant bit in case where the first code Q1[0] to Q1[2] has eight bits. In this case, suppose that the signals are latched in a state where one period of the reference clock signal REFCLK is divided by eight. At this time, a time point at which the first latch code Q1[0] to Q1[2] transits to 0 after transiting from 0 to 1 may correspond to a rising time point of the reference clock signal REFCLK just before a rising time point of the inverted feedback clock signal FBCLKB. That is, the phase information until the inverted feedback clock signal FBCLKB rises after the reference clock signal REFCLK rises is reflected. The first converter 31 decides the magnitude of the first code CODE1 based on the time point at which the first latch code Q1[0] to Q1[2] transits from 1 to 0. In these embodiments of the present invention, the first code CODE1 may have a magnitude of 6.

On the other hand, when the phase of the feedback clock signal FBCLK leads the phase of the reference clock signal REFCLK, that is, when the phase difference between the inverted feedback clock signal FBCLKB and the reference clock signal REFCLK is larger than 0 and smaller than 180 degrees, the first latch code Q1[0] to Q1[2] may be generated as 11000011 from the most significant bit in case where the first latch code Q1[0] to Q1[2] has eight bits. At this time, a time point at which the first latch code Q1[0] to Q1[2] transits from 1 to 0 corresponds to a rising time point of the reference clock signal REFCLK just before a rising time point of the inverted feedback clock signal FBCLB. That is, the phase information until the inverted feedback clock signal FBCLKB rises after the reference clock signal REFCLK rises is reflected into the first latch code Q1[0] to Q1[2]. The first converter 31 decides the magnitude of the first code CODE1 based on the time point at which the first latch code Q1[0] to Q1[2] transits from 1 to 0. In these embodiments of the present invention, the first code CODE1 may have a magnitude of 2.

Figure 5:
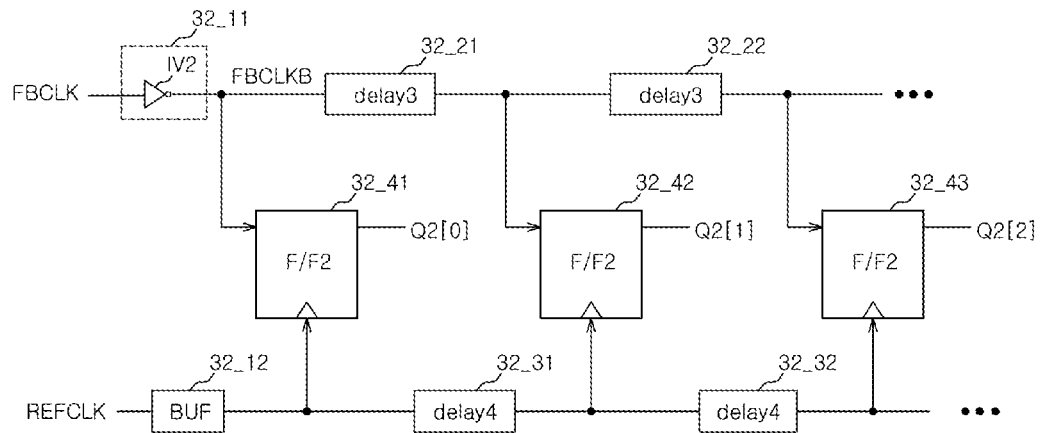
FIG. 5 is a circuit diagram illustrating an embodiment of a second converter of FIG. 3.

FIG. 5 is a circuit diagram illustrating an embodiment of the second converter 32.

The second converter 32 uses the reference clock signal REFCLK, in order to convert the phase of the feedback clock signal FBCLK into the second code CODE2. The second converter 32 latches the feedback clock signal FBCLK using the reference clock signal REFCLK, and converters the phase of the feedback clock signal FBCLK into a second latch code Q2[0] to Q2[2].

Specifically, the second converter 32 may include an inverter (IV2) 32_11, a buffer 32_12, a plurality of third delays 32_21 and 32_22, a plurality of fourth delays 32_31 and 32_32, and a plurality of second flip-flops 32_41 to 32_43.

The inverter 32_11 may be configured to receive the feedback clock signal FBCLK and generate the inverted feedback clock signal FBCLKB.

The buffer 32_12 may be configured to receive the reference clock signal REFCLK and delay the reference clock signal REFCLK by the same delay amount as a delay amount of the inverter 32_12. The buffer 32_12 serves to compensate for the delay amount caused by the inverter 32_12.

The plurality of third delays 32_21 and 32_22 are configured to sequentially delay the inverted feedback clock signal FBCLKB by a third delay amount.

The plurality of fourth delays 32_31 and 32_32 are configured to sequentially delay the reference clock signal REFCLK by a fourth delay amount.

Additionally, the third delay amount may be set to be larger than the fourth delay amount and set to be equal to the first delay amount, and the fourth delay amount may be set to be equal to the second delay amount.

The plurality of second flip-flops 32_41 to 32_43 are configured to latch the inverted feedback clock signal FBCLKB and outputs of the third delays 32_21 and 32_22 in response to the reference clock signal REFCLK and outputs of the fourth delays 32_31 and 32_32, respectively, and output the latch results as the respective bits of the second latch code Q2[0] to Q2[2]. That is, the plurality of second flip-flops 32_41 to 32_43 delay the inverted feedback clock signal FBCLKB by a predetermined phase based on the reference clock signal REFCLK, and output the level of the inverted feedback clock signal FBCLKB as the second latch code Q2[0] to Q2[2]. Therefore, the phase information of the feedback clock signal FBCLKB is reflected into the second latch code Q2[0] to Q2[2].

The delay locked loop is locked when the reference clock signal REFCLK and the feedback clock signal FBCLK have substantially the same phase. Therefore, when the delay locked loop is locked, the reference clock signal REFCLK and the inverted feedback clock signal FBCLKB have a phase difference of 180 degrees. When the phase of the feedback clock signal FBCLK lags the phase of the reference clock signal REFCLK, that is, when the phase difference between the inverted feedback clock signal FBCLKB and the reference clock signal REFCLK is larger than 180 degrees and smaller than 360 degrees, the second latch code Q2[0] to Q2[2] may be generated as 11000011 from the most significant bit in case where the second latch code Q2[0] to Q2[2] has eight bit, for example. In this case, suppose that the signals are latched in a state where one period of the reference clock signal REFCLK is divided by eight. At this time, a time point at which the second code Q2[0] to Q2[2] transits from 1 to 0 corresponds to a rising time point of the inverted feedback clock signal FBCLK just before a rising time point of the reference clock signal REFCLK. That is, the phase information until the reference clock signal REFCLK rises after the inverted feedback clock signal FBCLKB rises is reflected. The second converter 32 decides the magnitude of the second code CODE2 based on the time point at which the level of the second latch code Q2[0] to Q2[2] transits from 1 to 0. In these embodiments of the present invention, the second code CODE2 may have a magnitude of 2.

On the other hand, when the phase of the feedback clock signal FBCLK leads the phase of the reference clock signal REFCLK, that is, when the phase difference between the inverted feedback clock signal FBCLKB and the reference clock signal REFCLK is larger than 0 and smaller than 180 degrees, the second latch code Q2[0] to Q2[2] may be generated as 00111100 from the most significant bit in case where the second latch code Q2[0] to Q2[2] has eight bits, for example. Similarly, a time point at which the second latch code Q2[0] to Q2[2] changes to 1 after initially transiting from 0 to 1 corresponds to a rising time point of the inverted feedback clock signal FBCLKB just before a rising time point of the reference clock signal REFCLK. That is, the phase information until the reference clock signal REFCLK rises after the inverted feedback clock signal FBCLKB rises is reflected into the second latch code Q2[0] to Q2[2]. The second converter 32 decides the magnitude of the second code CODE2 based on the time point at which the level of the second latch code Q2[0] to Q2[2] transits from 1 to 0. In these embodiments of the present invention, the second code CODE2 may have a magnitude of 6.

Additionally, when the reference clock signal REFCLK and the feedback clock signal FBCLK have the same phase, that is, when the reference clock signal REFCLK and the inverted feedback clock signal FBCLKB have a phase difference of 180 degrees, the first code CODE1 and the second code CODE2 are equalized to each other.

Figure 6:
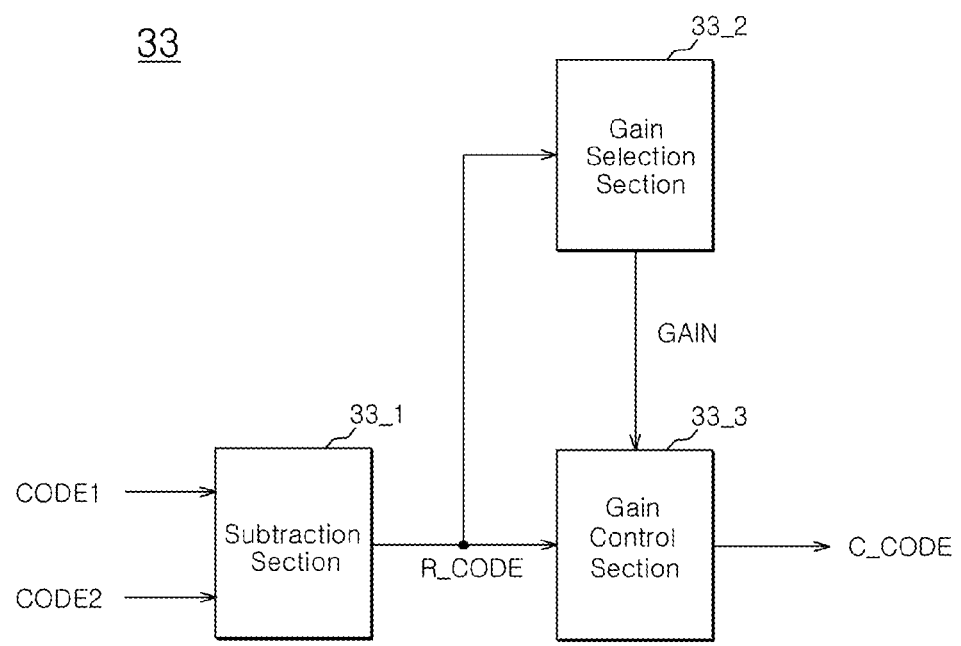
FIG. 6 is a block diagram illustrating an embodiment of a calculator of FIG. 3.

FIG. 6 is a block diagram illustrating an embodiment of the calculator 33.

The calculator 33 may include a subtraction section 33_1 and a gain control section 33_3.

The subtraction section 33_1 may be configured to perform a subtraction on the first and second codes CODE1 and CODE2 and generate a subtraction result code R_CODE. For example, the subtraction section 33_1 may subtract the first code CODE1 from the second code CODE2 and generate the subtraction result code R_CODE.

For example, when the phase of the feedback clock signal FBCLK lags the phase of the reference clock signal REFCLK, the subtraction section 33_1 generates the negative (−) subtraction result code R_CODE. On the other hand, when the phase of the feedback clock signal FBCLK lags the phase of the reference clock signal REFCLK, the subtraction section 33_1 generates the positive (+) subtraction result code R_CODE. The phase difference between the feedback clock signal FBCLK and the reference clock signal REFCLK is reflected into the magnitude of the subtraction result code R_CODE.

The gain control section 33_3 may be configured to multiply the subtraction result code R_CODE by a gain value GAIN and output the multiplication result as the calculation code C_CODE. The gain value GAIN is a variable for selecting whether to control the delay amount of the variable delay unit 10 by a relatively large unit or a relatively small unit. The gain control section 33_3 multiplies the subtraction result code R_CODE by the preset gain value GAIN so as to control the magnitude of the calculation code C_CODE.

The calculator 33 may further include a gain selection section 33_2 to select the gain value GAIN.

The gain selection section 33_2 may be configured to receive the subtraction result code R_CODE, and select a gain value GAIN according to the magnitude of the subtraction result code R_CODE. That is, when the subtraction result code R_CODE has a large magnitude, it means that the reference clock signal REFCLK and the feedback clock signal FBCLK have a large phase difference. Therefore, the gain selection section 33_2 selects and outputs a larger gain value GAIN. On the other hand, when the subtraction result code R_CODE has a small magnitude, it means that the reference clock signal REFCLK and the feedback clock signal FBCLK have a small phase difference. Therefore, the gain selection section 33_2 selects and outputs a smaller gain value GAIN, in order to precisely control the delay amount.

Figure 7:
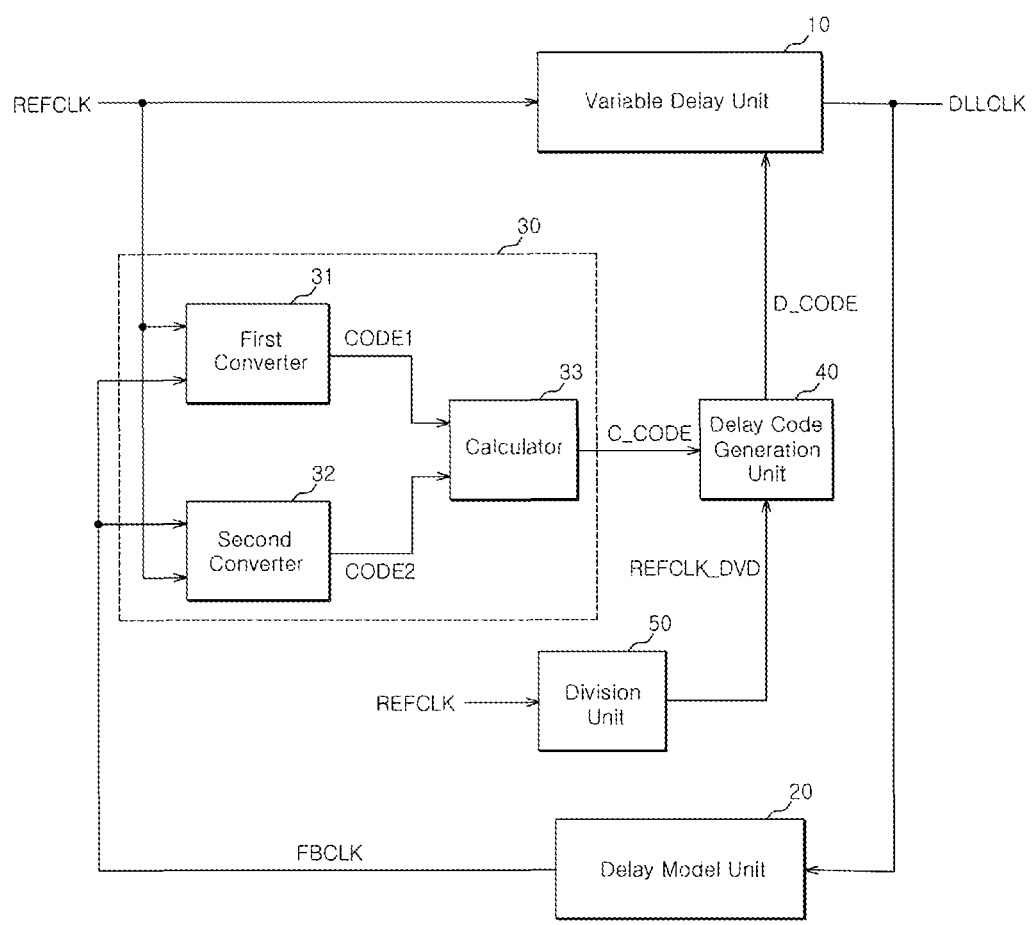
FIG. 7 is a circuit diagram illustrating an embodiment of the delay locked loop further including a division unit.

FIG. 7 is a circuit diagram illustrating an embodiment of the delay locked loop further including a division unit 50.

The delay locked loop of FIG. 7 may include a variable delay unit 10, a delay model unit 20, a calculation code generation unit 30, a delay code generation unit 40, and a division unit 50.

The variable delay unit 10, the delay model unit 20, and the calculation code generation unit 30 may be configured in the same manner as illustrated in FIG. 3. Thus, wherever possible, the same reference numbers will be used throughout the drawings to refer to the same or like parts.

Additionally, the delay code generation unit 40 adds an applied calculation code C_CODE to a stored delay code D_CODE and updates the delay code D_CODE into a new delay code D_CODE. The variable delay unit 10 controls a delay amount in response to the new delay code D_CODE.

At this time, when the update period of the delay code generation unit 40 is decreased, the magnitude of the delay code D_CODE is momentarily changed according to the change of the applied calculation code C_CODE. This causes a jitter in the variable delay unit 10. Therefore, the update period of the delay code D_CODE may be set to a predetermined time. The division unit 50 divides the reference clock signal REFCLK by a predetermined multiple and outputs the divided signal as a divided clock signal REFCLK_DVD, and the delay code generation unit 40 updates the delay code D_CODE in synchronization with the divided clock signal REFCLK_DVD.

Figure 8:
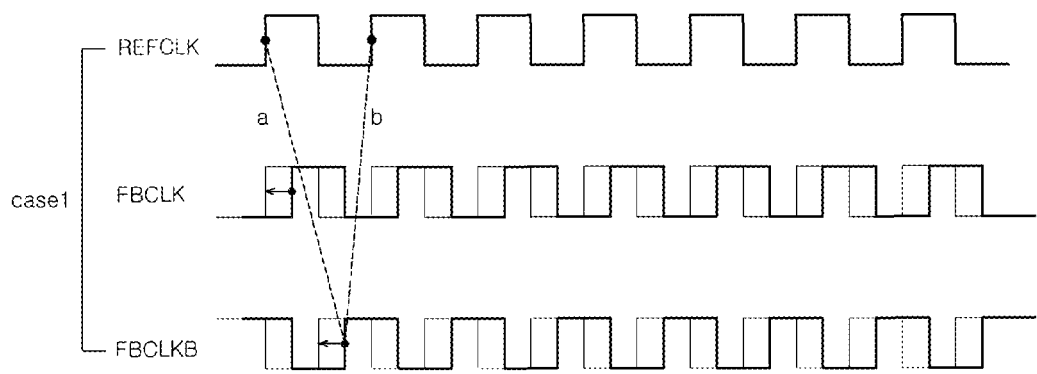
FIG. 8 is a waveform diagram illustrating the operation of the delay locked loop of FIG. 3.
Figure 8:
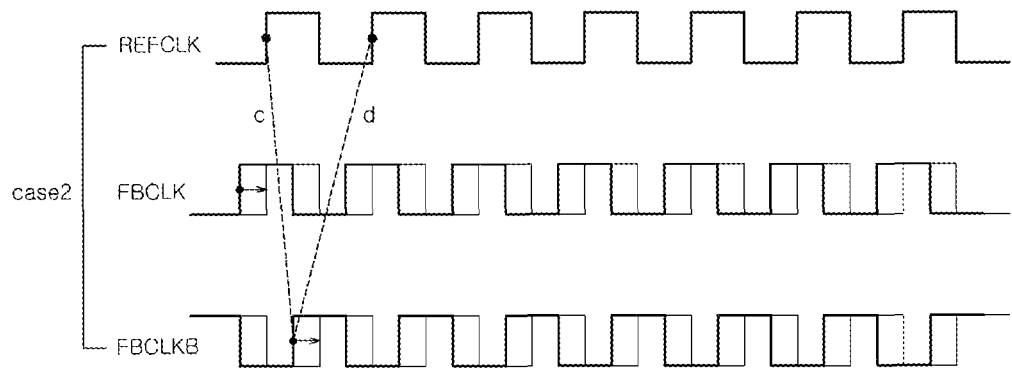

FIG. 8 is a waveform diagram illustrating the operation of the delay locked loop according to the embodiments of the present invention.

A first case case1 illustrates a case in which the phase of the feedback clock signal FBCLK lags the phase of the reference clock signal REFCLK, that is, the phase difference between the inverted feedback clock signal FBCLKB and the reference clock signal REFCLK is larger than 180 degrees and smaller than 360 degrees. The first code CODE1 corresponding to a period a is generated, and the second code CODE2 corresponding to a period b is generated. In this embodiment of the present invention, since the negative calculation code C_CODE is generated, the variable delay unit 10 reduces the delay amount of the reference clock signal REFCLK. Thus, the phase of the feedback clock signal FBCLK is moved forward.

A second case case2 illustrates a case in which the phase of the feedback clock signal FBCLK leads the phase of the reference clock signal REFCLK, that is, when the phase difference between the inverted feedback clock signal FBCLKB and the reference clock signal REFCLK is larger than 0 and smaller than 180 degrees. The first code CODE1 corresponding to a period c is generated, and the second code CODE2 corresponding to a period d is generated. In this embodiment of the present invention, since the positive calculation code C_CODE is generated, the variable delay unit 10 increases the delay amount of the reference clock signal REFCLK. Thus, the phase of the feedback clock signal FBCLK is moved backward.

When the reference clock signal REFCLK and the feedback clock signal FBCLK have the same phase, that is, when the reference clock signal REFCLK and the inverted feedback clock signal FBCLKB have a phase difference of 180 degrees, the first and second codes CODE1 and CODE2 are equalized to each other. At this time, the delay locked loop is locked.

While various embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A delay locked loop comprising:
a variable delay unit configured to delay a reference clock signal in response to a delay code and generate a delay locked loop clock signal;
a delay model unit configured to delay the delay locked loop clock signal by a modeled delay value and output delayed delay locked loop clock signal as a feedback clock signal;
a calculation code generation unit configured to convert a phase of the reference clock signal and a phase of the feedback clock signal into a first code and a second code, respectively, and perform a calculation on the first and second codes so as to generate a calculation code; and
a delay code generation unit configured to control the delay code in response to the calculation code, wherein the calculation code generation unit comprises:
a first converter configured to receive the reference clock signal and the feedback clock signal and generate the phases of the reference clock signal as the first code;
a second converter configured to receive the reference clock signal and the feedback clock signal and generate the phase of the feedback clock signal as the second code; and
a calculator configured to calculate a difference between the first and second codes and generate the calculation code.

2. The delay locked loop according to claim 1, wherein the first converter generates a rising time point of the reference clock signal before a rising time point of an inverted feedback clock signal as the first code, based on the rising time point of the inverted feedback clock signal.

3. The delay locked loop according to claim 1, wherein the first converter comprises:
a plurality of first delays elements configured to sequentially delay a buffered reference clock signal by a first delay amount;
a plurality of second delays elements configured to sequentially delay an inverted feedback clock signal by a second delay amount; and
a plurality of first flip-flops configured to sequentially latch outputs of the first delays elements according to outputs of the second delays elements, respectively, and generate a first latch code.

4. The delay locked loop according to claim 3, wherein the first delay amount is set to be larger than the second delay amount.

5. The delay locked loop according to claim 3, wherein the first converter converts the first latch code into the first code.

6. The delay locked loop according to claim 1, wherein the second converter generates a rising time point of an inverted feedback clock signal before a rising time point of the reference clock signal as the second code, based on the rising time point of the reference clock signal.

7. The delay locked loop according to claim 1, wherein the second converter comprises:
a plurality of third delays elements configured to sequentially delay an inverted feedback clock signal by a third delay amount;
a plurality of fourth delays elements configured to sequentially delay a buffered reference clock signal by a fourth delay amount; and
a plurality of second flip-flops configured to sequentially latch outputs of the third delays elements according to outputs of the fourth delays elements, respectively, and generate a second latch code.

8. The delay locked loop according to claim 7, wherein the third delay amount is set to be larger than the fourth delay amount.

9. The delay locked loop according to claim 7, wherein the second converter converts the second latch code into the second code.

10. The delay locked loop according to claim 1, wherein the calculator comprises:
a subtraction section configured to perform a subtraction on the first and second codes and generate a subtraction result code; and
a gain control section configured to multiply a gain value by the subtraction result code and output the multiplication result as the calculation code.

11. The delay locked loop according to claim 10, wherein the calculator further comprises a gain selection section configured to control the gain value in response to the subtraction result code.

* * * * *